United States Patent
Baudasse et al.

(10) Patent No.: US 10,214,302 B2
(45) Date of Patent: Feb. 26, 2019

(54) DEPLOYABLE STRUCTURE COMPRISING A SET OF SOLAR GENERATORS, SYSTEM FOR DEPLOYING SUCH A DEPLOYABLE STRUCTURE AND SATELLITE COMPRISING SUCH A SYSTEM

(71) Applicant: THALES, Courbevoie (FR)

(72) Inventors: Yannick Baudasse, Cannes-la-Bocca (FR); Stéphane Vezain, Mandelieu (FR); Olivier Bardel, Cannes-la-Bocca (FR); Didier Stanek, Cannes la Bocca (FR)

(73) Assignee: THALES, Courbevoie (FR)

( * ) Notice: Subject to any disclaimer, the term of this patent is extended or adjusted under 35 U.S.C. 154(b) by 256 days.

(21) Appl. No.: 15/364,008

(22) Filed: Nov. 29, 2016

(65) Prior Publication Data
US 2017/0158358 A1 Jun. 8, 2017

(30) Foreign Application Priority Data

Dec. 2, 2015 (FR) ...................................... 15 02511

(51) Int. Cl.
*B64G 1/22* (2006.01)
*B64G 1/44* (2006.01)

(52) U.S. Cl.
CPC ............ *B64G 1/222* (2013.01); *B64G 1/443* (2013.01)

(58) Field of Classification Search
CPC ................................. B64G 1/222; B64G 1/443
See application file for complete search history.

(56) References Cited

U.S. PATENT DOCUMENTS

| 3,735,943 | A | * | 5/1973 | Fayet | B64G 1/222 |
| | | | | | 136/245 |
| 4,630,791 | A | * | 12/1986 | Chapman | B64G 1/14 |
| | | | | | 136/245 |
| 8,616,502 | B1 | | 12/2013 | Stribling et al. | |
| 8,683,755 | B1 | | 4/2014 | Spence et al. | |
| 8,894,017 | B1 | * | 11/2014 | Baghdasarian | B64G 1/443 |
| | | | | | 136/245 |
| 9,150,312 | B2 | * | 10/2015 | Ellinghaus | B64G 1/00 |
| 10,005,571 | B2 | * | 6/2018 | Marks | B64G 1/443 |
| 2011/0210209 | A1 | | 9/2011 | Taylor et al. | |

FOREIGN PATENT DOCUMENTS

| EP | 2 108 901 A2 | 10/2009 |
| FR | 2 508 413 A1 | 12/1982 |
| FR | 2 998 876 A1 | 6/2014 |

* cited by examiner

*Primary Examiner* — Brian M O'Hara
(74) *Attorney, Agent, or Firm* — Baker & Hostetler LLP (57) ABSTRACT

A deployable structure comprises a mast and two storage rollers each supporting a flexible solar generator, the two storage rollers being articulated on the mast. The mast comprises at least one longitudinal rod and two lateral arms, inclined angularly in two opposite directions that are symmetrical relative to the longitudinal rod, each lateral arm comprising an end provided with a hollow guide. Each storage roller has a longitudinal axis comprising a bent end forming a pivot respectively articulated inside the hollow guide of a corresponding lateral arm, the pivot of each storage roller having an axis of revolution different from the longitudinal axis of the corresponding storage roller.

10 Claims, 10 Drawing Sheets

DEPLOYABLE STRUCTURE COMPRISING A SET OF SOLAR GENERATORS, SYSTEM FOR DEPLOYING SUCH A DEPLOYABLE STRUCTURE AND SATELLITE COMPRISING SUCH A SYSTEM

CROSS-REFERENCE TO RELATED APPLICATIONS

This application claims priority to foreign French patent application No. FR 1502511, filed on Dec. 2, 2015, the disclosure of which is incorporated by reference in its entirety.

FIELD OF THE INVENTION

The present invention relates to a deployable structure comprising a set of solar generators, a system for deploying such a deployable structure and a satellite comprising such a system. It applies to the field of space equipment items which have to be deployed in orbit and more particularly to the solar generators installed on a satellite.

BACKGROUND

The structures that are deployable in space, of solar generator type for example, generally consist of mutually articulated rigid panels, these panels being, in stored position stacked one on top of the other. These structures have the advantage of having a controlled kinematic but present the disadvantage of significant weight per unit of surface area and inertia. Furthermore, the rigid structures occupy, in stored position, a significant bulk under the nose cone of a launch vehicle. Since the space allotted to the deployable structures under the nose cone of a launch vehicle is limited, it is important to reduce the bulk of these deployable structures when they are in stored position so as to optimize the surface area thereof in deployed position.

In order to counter these drawbacks, it is known practice, notably from the document FR 2 998 876, to produce flexible solar generators which offer numerous competitive advantages over the rigid panels. In particular, they have a greater capacity for adjustment and offer an increase in the useful surface area in deployed position.

The document U.S. Pat. No. 8,894,017 describes a set of deployable solar generators articulated at the end of a mast fixed to a face of a satellite. Different segments supporting the flexible solar generators are mounted end-to-end and mutually articulated. However, in stored position, the segments supporting the flexible solar generators are not operational which necessitates adding a rigid solar panel, mounted on the mast, which, in stored position, comprises active solar cells oriented outward from the satellite to be able to power the satellite. Moreover, it is necessary to add means for steering the rigid solar panel to be able to use it also in deployed position. Furthermore, the deployment of the mast and the solar generators is performed sequentially, which necessitates several different controls for fully deploying all the deployable structure.

SUMMARY OF THE INVENTION

The aim of the invention is to produce a deployable structure comprising a set of solar generators and a system for deploying this deployable structure that does not include the drawbacks of the existing deployable structures and deployment systems, offering the advantage of having little bulk, being simple to produce, of a simplification of the deployment sequences and of the associated controls, making it possible to have an area of solar cells operational in stored position and allowing for a simultaneous deployment of the mast and of the flexible solar generators.

For that, the invention relates to a deployable structure comprising a set of solar generators, the deployable structure comprising a mast and two storage rollers each supporting a flexible solar generator, the two storage rollers being articulated on the mast, the mast having a first end, called base, a second end opposite the base, and comprising at least one longitudinal rod situated between the first and the second ends. The mast further comprises two lateral arms mounted at the second end, the two lateral arms being inclined angularly in two opposite directions that are symmetrical relative to the longitudinal rod, each lateral arm comprising an end provided with a hollow guide. Each storage roller has a longitudinal axis comprising a bent end forming a pivot respectively articulated inside the hollow guide of a corresponding lateral arm, the pivot of each storage roller having an axis of revolution different from the longitudinal axis of the corresponding storage roller.

Advantageously, the two lateral arms of the mast can be secured to the longitudinal rod.

Alternatively, the rod can comprise two distinct longitudinal parts, respectively called first rod and second rod, the second rod being parallel to the first rod and articulated on an axis of rotation situated at the second end of the mast, the axis of rotation being at right angles to the first rod and to the second rod, the two lateral arms being secured to the second rod.

Advantageously, each flexible solar generator can comprise a terminal end rigidly attached to a respective fixed rigid anchor point, and the deployable structure can further comprise at least one rigid flap fixed to the rigid anchor point, in the extension of a flexible solar generator, the rigid flap comprising solar cells permanently oriented towards the sun.

Alternatively, in stored position, each flexible solar generator can be partially wound around the storage roller, and comprise an end part provided with solar cells permanently oriented towards the sun.

Advantageously, the hollow guides of each lateral arm of the mast can be oriented at 45° relative to the mast and relative to the respective longitudinal axes of the storage rollers.

The invention also relates to a deployment system comprising a deployable structure and further comprising a single motor comprising a rotor mounted on the base of the mast, the rotor having an axis of rotation at right angles to the longitudinal rod of the mast, a first pulley situated at the base of the mast and having an axis of revolution aligned with the axis of rotation of the rotor, two pulleys driving the storage rollers, in rotation, respectively fixed to the bent ends of each storage roller, return pulleys fixed to the lateral arms of the mast and a set of cables linking the first pulley to the pulleys driving each storage roller via the return pulleys, the driving pulleys having a respective axis of rotation coinciding with a longitudinal axis of the respective hollow guides.

Advantageously, each pulley driving a storage roller can have an axis of rotation forming an angle of 45° relative to the longitudinal axis of the corresponding storage roller and relative to the longitudinal rod of the mast.

The invention relates finally to a satellite comprising such a deployment system.

BRIEF DESCRIPTION OF THE DRAWINGS

Other particular features and advantages of the invention will become clearly apparent hereinbelow in the description given as a purely illustrative and nonlimiting example, with reference to the attached schematic drawings which represent.

DETAILED DESCRIPTION

Figure 1:
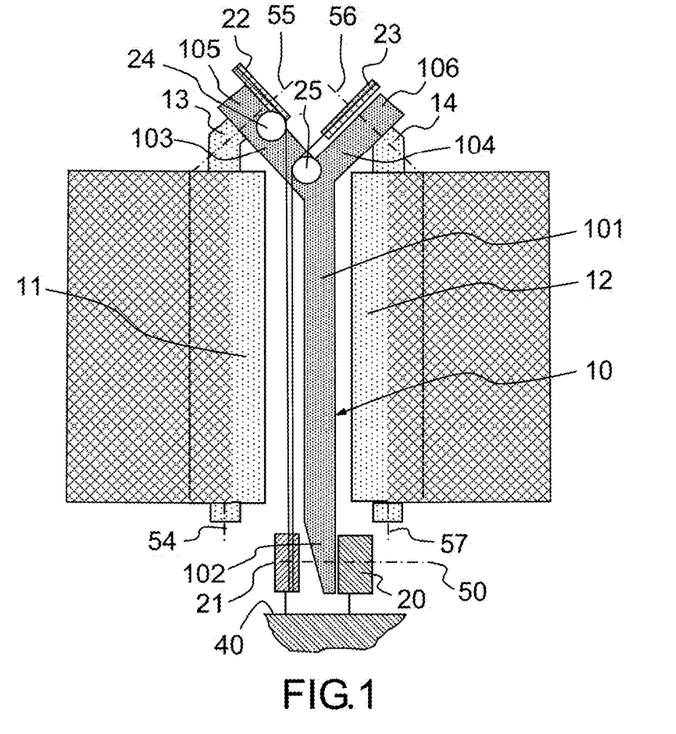
FIG. 1: a diagram from the front, in stored position, of an exemplary deployable structure comprising two storage rollers on which are wound respective flexible solar generators, and of an associated deployment system, according to the invention.

The deployable structure, represented in stored position in FIG. 1, comprises a mast 10 and two storage rollers 11, 12, on which are wound flexible solar generators, the two storage rollers, for example cylindrical, each support a flexible solar generator and each comprise a respective pivot 13, 14 articulated on the mast. In stored position, the two storage rollers 11, 12 are parallel to the mast 10 and the flexible solar generators are wound around the two storage rollers. The mast comprises a longitudinal rod 101 situated between a first end 102 of the mast, called base, and a second end opposite the base, and two lateral arms 103, 104 situated at the second end of the mast. The two lateral arms 103, 104 are inclined angularly in two opposite directions that are symmetrical relative to the longitudinal rod 101. The two lateral arms 103, 104 can be secured to the rod 101. The two lateral arms can also consist of a metal or composite single-piece fitting.

Each lateral arm 103, 104 comprises an end provided with a cylindrical hollow guide 105, 106, the longitudinal axis 55, 56 of which is inclined angularly relative to the longitudinal rod 101 of the mast 10. Each storage roller 11, 12 has a longitudinal axis comprising a bent end forming the pivot 13, 14 articulated inside the corresponding hollow guide 105, 106. The pivot 13, 14 of each storage roller has an axis of revolution 55, 56 different from the longitudinal axis 54, 57 of the corresponding storage roller 11, 12. The articulation between the pivot 13, 14 of each storage roller 11, 12 and the corresponding hollow guide 105, 106, allows a rotation of the pivot about its axis of revolution.

Figure 2:
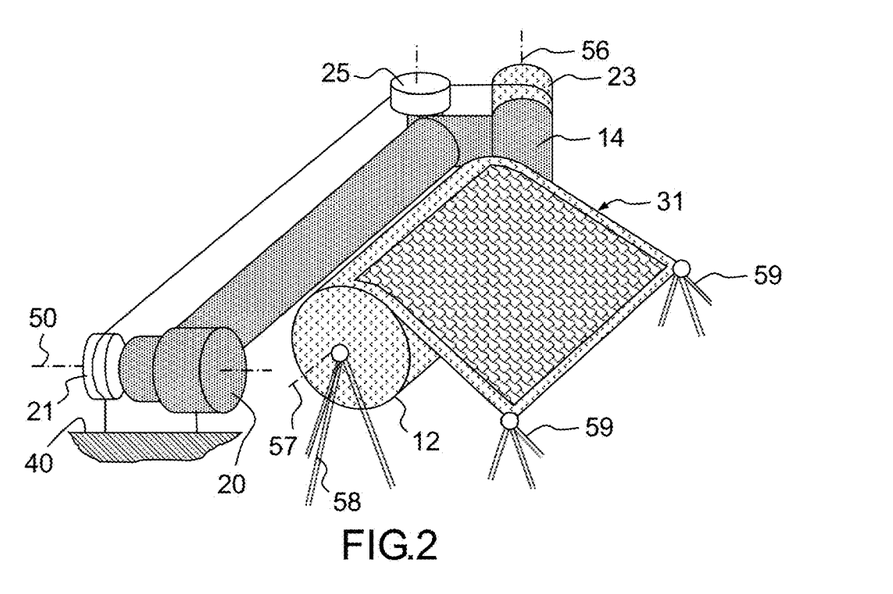
FIG. 2: a perspective diagram, in stored position, of an exemplary deployable structure comprising a single storage roller on which is wound a flexible solar generator, and of an associated deployment system, according to the invention.
Figure 3A:
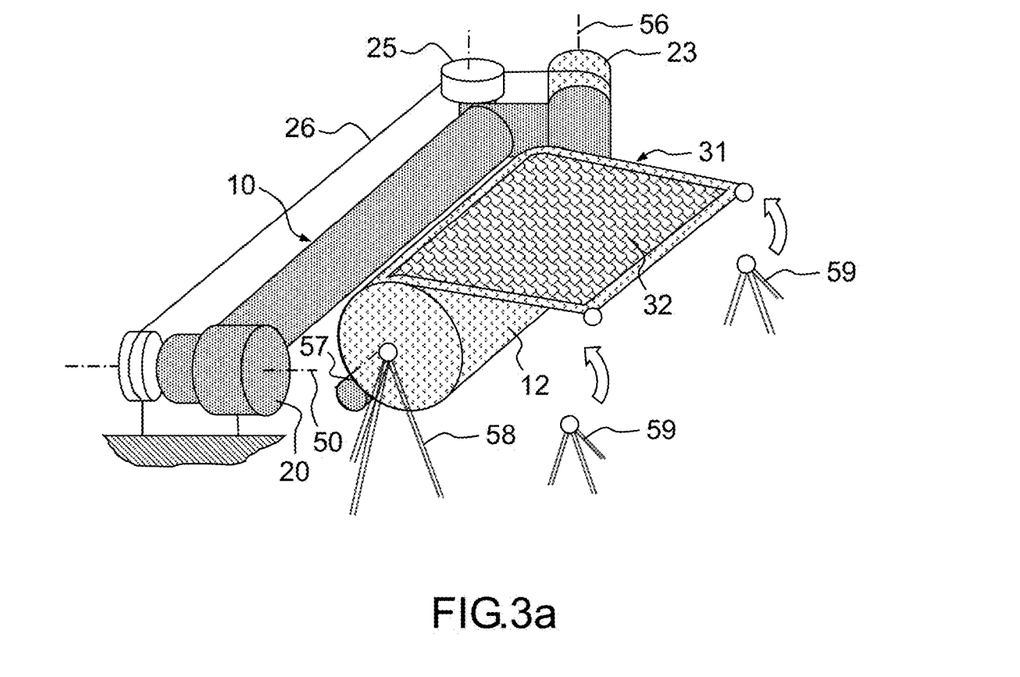
FIG. 3a: a perspective diagram, illustrating the deployable structure of FIG. 2, after unlocking, according to the invention.
Figure 3B:
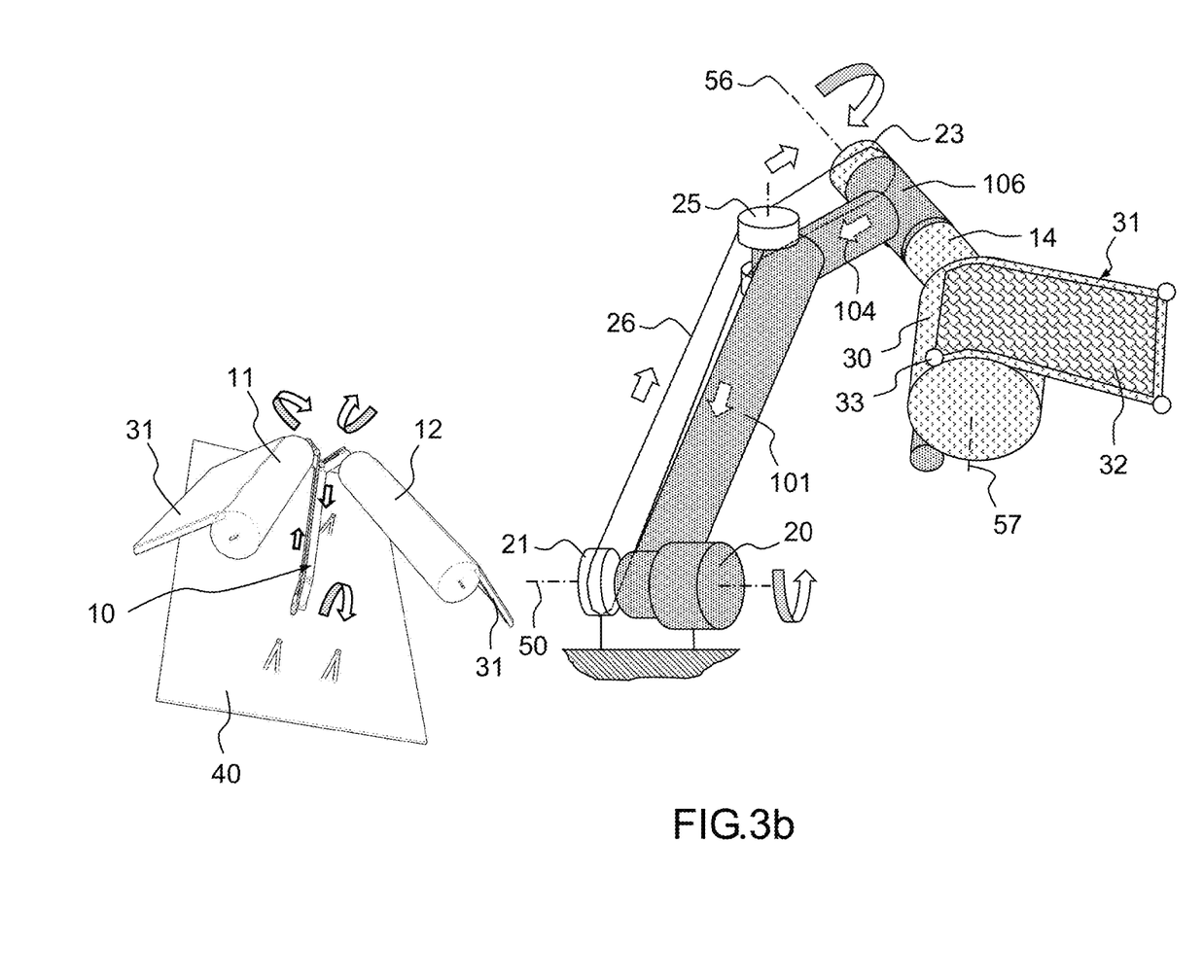
FIGS. 3b, 3c, 3d: perspective diagrams, illustrating the deployable structures of FIGS. 1 and 2, respectively at the start, during and at the end of deployment, according to the invention.
Figure 3C:
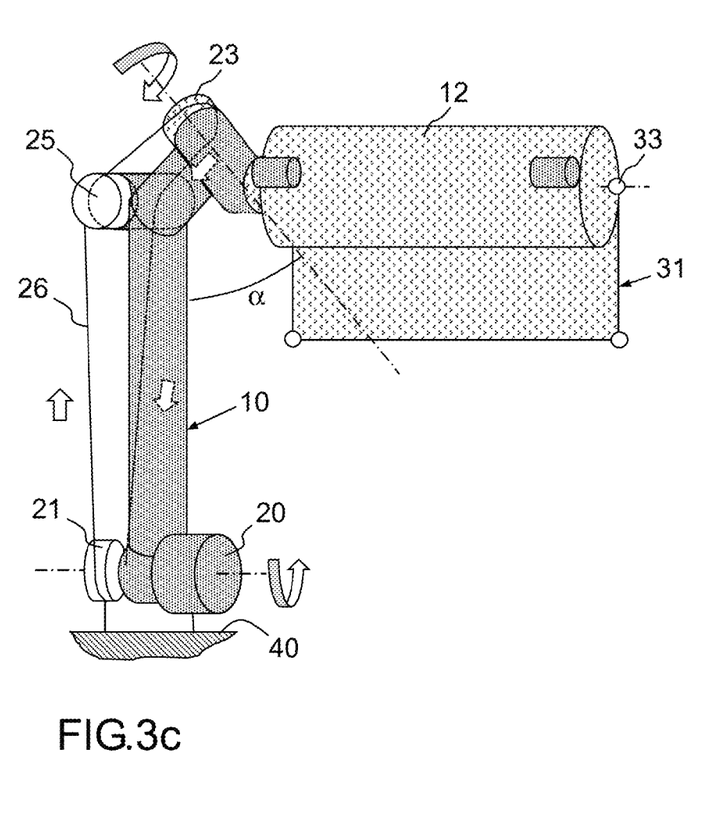
Figure 3D:
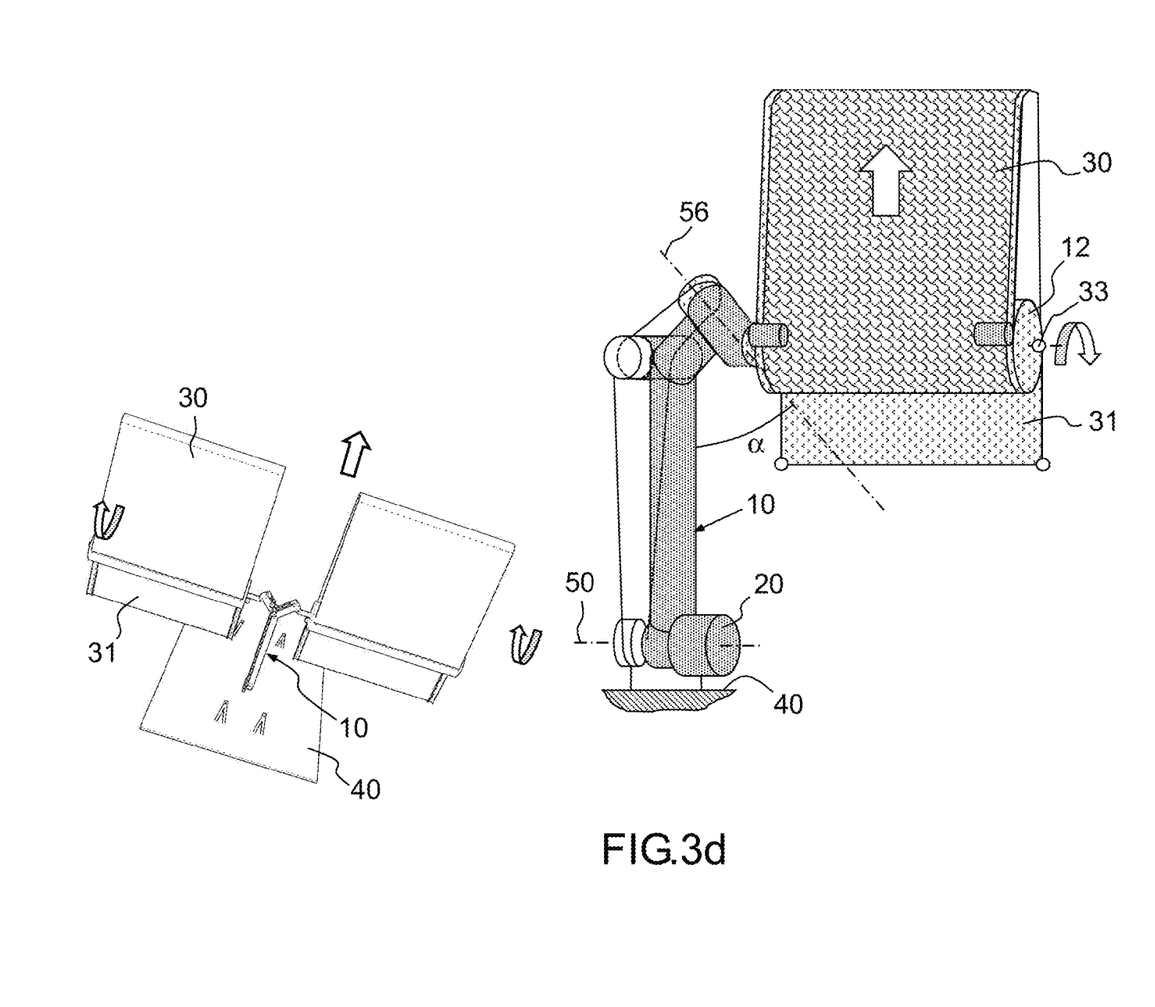

As illustrated in particular in FIGS. 3c and 3d, the respective hollow guides 105, 106 of each lateral arm 103, 104 of the mast and the axes of revolution of the pivots 13, 14 of each storage roller can be, preferably, oriented in a direction forming an angle α of 45° relative to the longitudinal rod of the mast and relative to the respective longitudinal axes of the storage rollers so as to minimize the number of sequences necessary for the deployment of the structure and the good positioning of the storage rollers in deployed position. In particular, that makes it possible, in deployed position, to obtain a positioning of the longitudinal axis of the storage rollers at right angles to the rod of the mast, as illustrated in FIG. 3c, and therefore to allow a deployment of the solar generators in a direction parallel to the rod of the mast as represented in FIG. 3d. Of course, it is also possible to choose an orientation of the hollow guides in a direction forming an angle of value other than 45° relative to the longitudinal rod 101 of the mast 10 and relative to the respective longitudinal axes of the storage rollers 11, 12. In FIGS. 2 and 3a, a single storage roller is represented in order to simplify these figures, but, obviously, this deployment kinematic is valid for two rollers positioned symmetrically relative to the central mast 10, as illustrated in each of the FIGS. 3b, 3c, 3d in which two examples of deployment kinematic for deployable structures respectively comprising one storage roller and two storage rollers are represented.

The system for deploying the deployable structure comprises a single motor 20, of the regulating motor type, with a stator intended to be fixed onto a face 40 of the body 41 of a satellite and a rotor mounted directly on the base 102 of the mast, the rotor having an axis of rotation 50 at right angles to the rod 101 of the mast. The rotor of motor 20 is intended to drive the mast 10 in rotation about the axis of rotation 50 in order to deploy it. The deployment system also comprises a first pulley 21, situated at the base of the mast and intended to be fixed onto the face 40 of the body 41 of the satellite, two pulleys 22, 23 driving the storage rollers in rotation, respectively fixed to the bent ends of each storage roller, return pulleys 24, 25 fixed to the lateral arms of the mast and a set of cables 26 linking the first pulley 21 to the pulleys 22, 23 driving the storage roller via the return pulleys 24, 25. The first pulley 21 has an axis of revolution aligned with the axis of rotation 50 of the rotor of the motor 20. The driving pulleys 22, 23 have an axis of revolution coinciding with the axis of the respective hollow guides 105, 106 and their function is to deploy the storage rollers during the deployment of the mast, the deployment of the mast 10 and of the storage rollers 11, 12 thus being performed simultaneously. The return pulleys 24, 25 are fixed to the mast, for example at the point of connection between the longitudinal rod and each lateral arm, their axis of rotation being oriented in a direction at right angles to the mast. The first pulley 21 is meshed via cables to the return pulleys 24, 25, then to the driving pulleys 22, 23. The driving pulleys are directly fixed to the bent ends of the storage rollers and their axes of rotation are respectively oriented in the same direction as the longitudinal axes of the hollow guides and are therefore inclined angularly relative to the longitudinal rod of the mast. For example, when the longitudinal axes of the respective hollow guides of each lateral arm of the mast form an angle of 45° relative to the longitudinal rod of the mast and relative to the respective axes of revolution of the storage rollers, the axis of rotation of each driving pulley also forms an angle equal to 45°, relative to the axis of revolution of the corresponding storage roller and relative to the longitudinal rod of the mast.

Although a single return pulley is visible in the different figures, for each storage roller to be deployed, two return pulleys, diametrically opposite on the mast, are necessary to have a closed cable path, starting from the fixed pulley to the driving pulley via a first return pulley, then returning from the driving pulley to the fixed pulley via the second return pulley. In FIGS. 3b, 3c, 3d, the cable path is represented by a solid line on the visible face of the deployable structure, and by dotted lines on the opposite face which is hidden. For each storage roller, it is possible to use a single cable or two different cables, to go and return, to produce the complete path. Two different cable paths are necessary to deploy the two storage rollers 11, 12, the first pulley 21 being simultaneously connected to the two cable paths respectively dedicated to the two storage rollers.

Figure 4A:
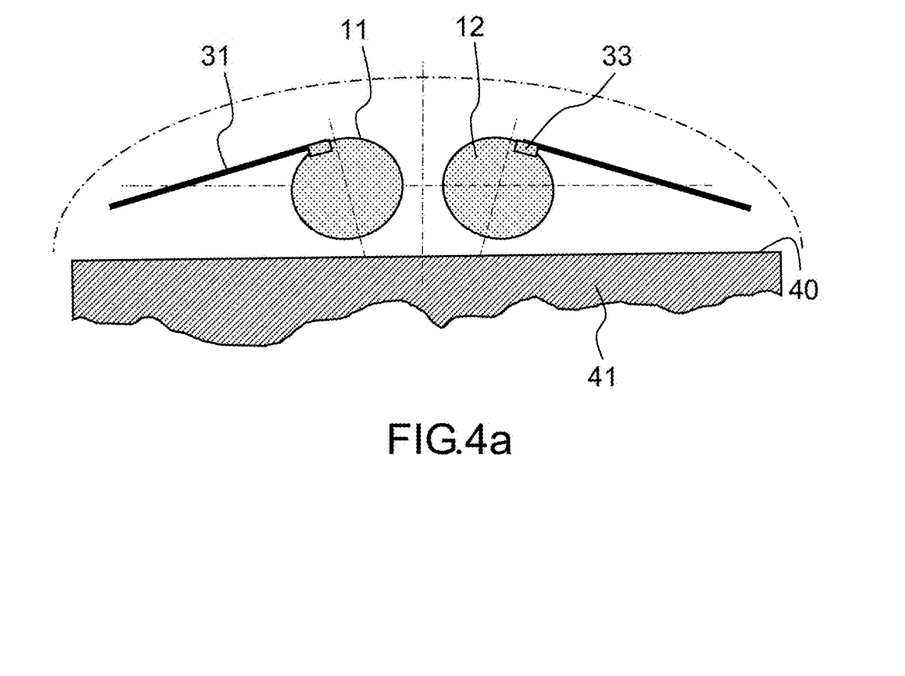
FIG. 4a: a transverse cross-sectional diagram, in stored position, of a deployable structure comprising two storage rollers provided with respective flexible solar generators, in which each solar generator further comprises a rigid flap in the extension of the flexible support, according to an embodiment of the invention.
Figure 4B:
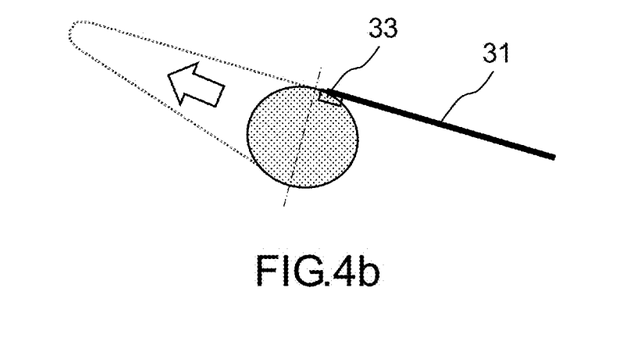
FIG. 4b: a transverse cross-sectional diagram, showing the direction of deployment of the deployable structure according to FIG. 4a, according to the invention.

Each storage roller 11, 12 supports a flexible solar generator 30 which, in stored position, is wound round the respective storage roller. Each flexible solar generator conventionally comprises, a flexible support on which solar cells are mounted. The flexible support of each flexible solar generator comprises a first end that can be wound around said storage roller and a terminal second end rigidly attached to a fixed rigid anchor point 33. Advantageously, according to a first embodiment corresponding to FIGS. 3b, 3c, 3d and to FIGS. 4a and 4b, the rigid anchor point 33 can be arranged diametrically opposite relative to the face 40 of the body 41 of the satellite and the deployable structure can further comprise a rigid flap 30 fixed to the rigid anchor point 33, in the extension of the flexible solar generator 30, the rigid flap being equipped with solar cells. In this case, in stored position, the flexible substrate is completely wound around the storage roller whereas the rigid flap remains permanently deployed. As represented in FIG. 4a, the rigid flap 31 comprises a rear face oriented towards the face 40 of the body 41 of the satellite and a front face permanently oriented toward the outside of the satellite, the front face of the rigid flap 31 being equipped with solar cells 32, permanently oriented towards the sun, during all the stored and deployed phases of the deployable structure. FIG. 4b illustrates, by way of dotted lines, the direction of deployment of a flexible solar generator 30 when the deployable structure further comprise a rigid flap 31 fixed in the extension of a corresponding flexible solar generator.

Figure 5A:
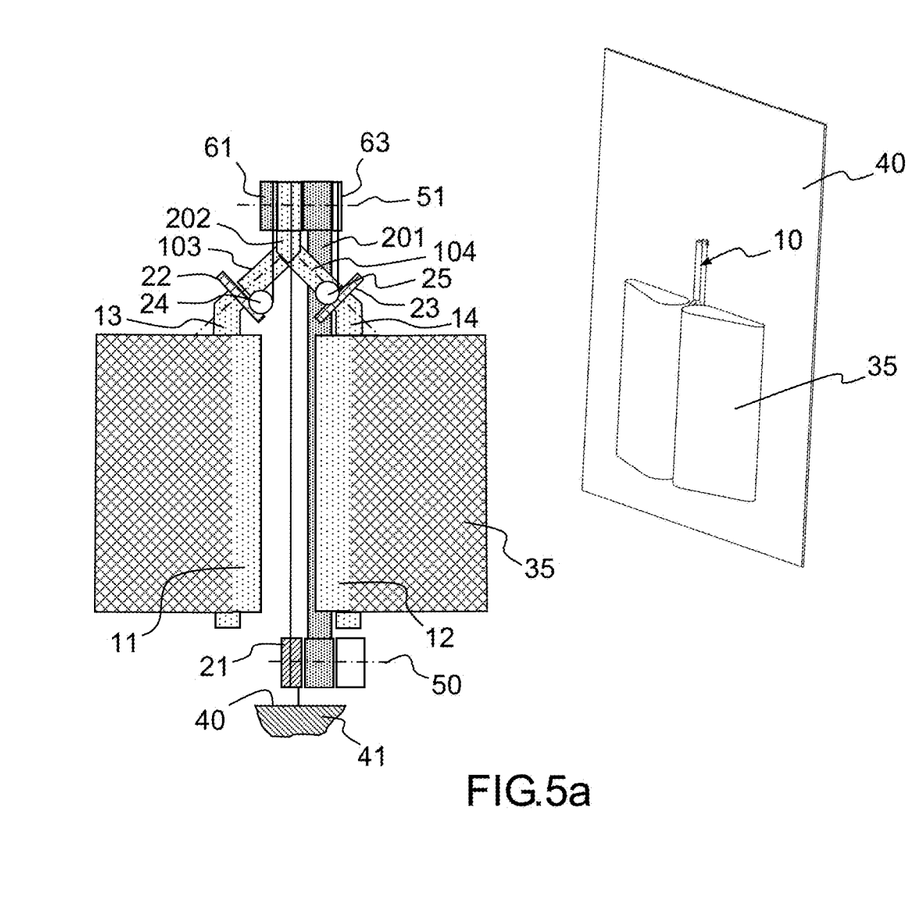
FIG. 5a: two perspective diagrams, in stored position, of a variant embodiment of the deployable structure comprising two storage rollers provided with respective flexible solar generators, in which, in stored position, the flexible solar generators are partially wound, according to the invention.
Figure 5B:
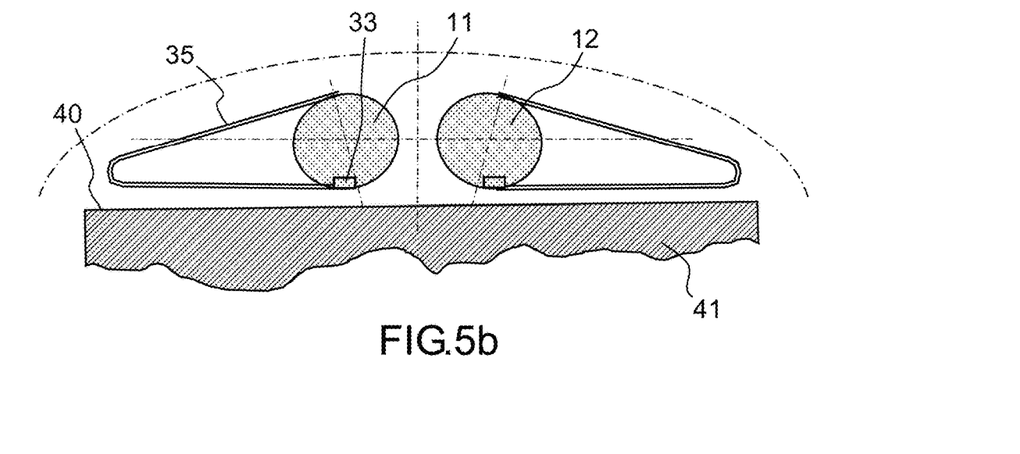
FIG. 5b: a transverse cross-sectional diagram, in stored position, of the deployable structure according to FIG. 5a, according to the invention.

According to a variant embodiment of the invention, as shown in FIG. 5a, the longitudinal rod of the mast 10 can comprise two distinct parts 201, 202. The two distinct parts consist of a first longitudinal rod 201 fixed between the two ends of the mast and a second longitudinal rod 202 articulated on an axis of rotation 51 situated at the second end of the mast. The second rod is parallel to the first rod and the axis of rotation 51 is at right angles to the first rod and to the second rod of the mast. The two lateral arms 103, 104, inclined angularly and arranged symmetrically relative to the mast, are secured to the second rod 202. In this variant embodiment of the invention, the solar generator does not comprise a rigid flap but, for the set of solar generators to be able to supply energy throughout the stored and deployed phases of the deployable structure, the rigid anchor point 33 can be positioned face to with face 40 with the body 41 of the satellite as represented in FIG. 5b and each flexible solar generator 30 can, in stored position, be partially wound around the storage roller 11, 12 and can have an end part 35 that is partially unwound and provided with solar cells permanently oriented towards the sun.

Figure 5C:
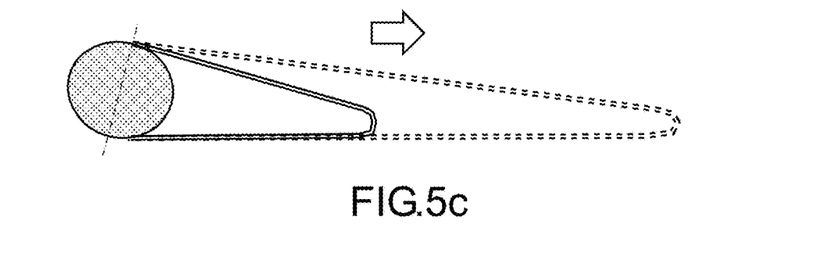
FIG. 5c: a transverse cross-sectional diagram, showing the direction of deployment of the deployable structure according to FIG. 5a, according to the invention.

FIG. 5c illustrates, by way of dotted lines, the direction of deployment of a flexible solar generator according to this variant embodiment of the invention, in which the solar generator does not comprise a rigid flap. The partially unwound end part 35, or respectively, the rigid flat 31, makes it possible to supply the energy necessary to the satellite during the ballistic phase in which the satellite is placed in orbit, and also contributes, together with the flexible solar generators, to supplying the satellite with electrical energy during the orbital phase of the satellite.

This deployment system allows a simultaneous deployment of the mast 10 and of the two rollers 11, 12 by using a single motor 20 mounted at the base 102 of the mast. Different successive deployment sequences, concerning the simplified case in which a single roller is mounted on a mast which comprises only a single longitudinal rod 101, are illustrated in FIGS. 3a, 3b, 3c, 3d. When two storage rollers are mounted on a mast, the two rollers are deployed simultaneously and symmetrically relative to the mast. In stored position, as represented in FIG. 2, the storage rollers 11, 12 on which the solar generators are wound are arranged with their respective longitudinal axis parallel to the rod of the mast and locked, in the stored position, on stacking feet 58 fixed to a face of the satellite. The rigid solar panels 31 provided with the solar cells 32 oriented outwards are also locked onto dedicated stacking feet 59, fixed to the face 40 of the satellite.

The triggering of the deployment of the deployable structure begins with the unlocking of the rigid solar panels 31, then of the rollers 11, 12 as represented in FIG. 3b, then with the actuation of the rotor of the motor 20 situated at the base of the mast. When the rotor of the motor 20 is actuated in rotation about its axis of rotation 50, it drives the mast 10 in rotation, which causes a winding of the cable 26 around the first pulley 21. The winding of the cable causes a tension on a return pulley 25 which starts to rotate and transmits this tension to the driving pulley 23 which also starts to rotate. Since the axis of rotation of the driving pulley is secured to the bent end forming the pivot 13, 14 of the storage rollers 11, 12, the rotation of the driving pulley then triggers the rotation of the storage rollers which are deployed. The driving of the mast by the rotor of the motor 20 therefore provokes, via the pulleys, the simultaneous deployment of the rollers 11, 12. To switch from the stored position to the deployed position, the mast 10 undergoes a rotation of 90° about the axis of rotation 50 of the rotor of the motor 20. During this rotation of the mast, to be correctly oriented, each storage roller 11, 12 must undergo a rotation of 180° about the axis 55, 56 of the pivot 13, 14 oriented at 45° and the driving pulley must therefore turn by 180°. For that, each driving pulley 22, 23 must have a winding diameter two times smaller than the winding diameter of the first pulley 21 situated at the base of the mast. When the mast and the rollers are in deployed position, the mast and the rollers are locked in this position and the deployment of the flexible generators is accomplished. The deployment of each solar generator can be accomplished, as is known, independently, for example by means of one or more tape measures fixed to a flexible fabric supporting the flexible solar generators.

Figure 6A:
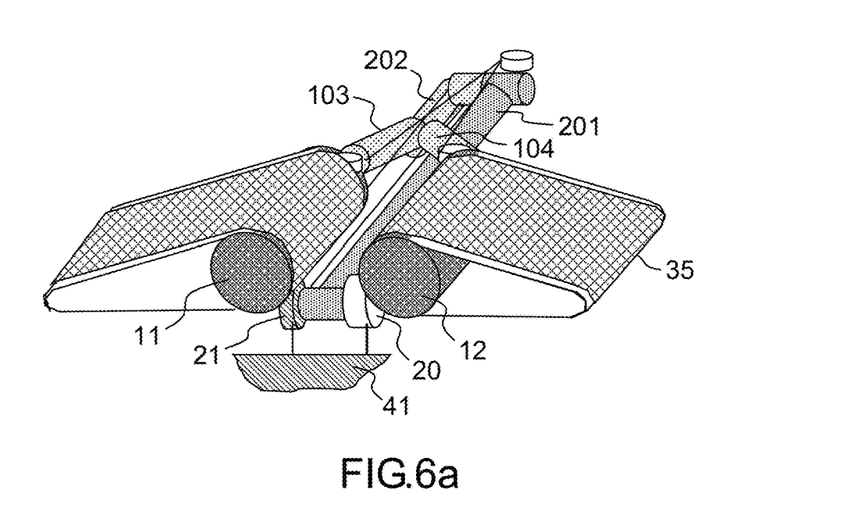
FIGS. 6a, 6b, 6c: three successive sequences, in perspective, of deployment of the deployable structure of FIG. 5a according to the invention.
Figure 6B:
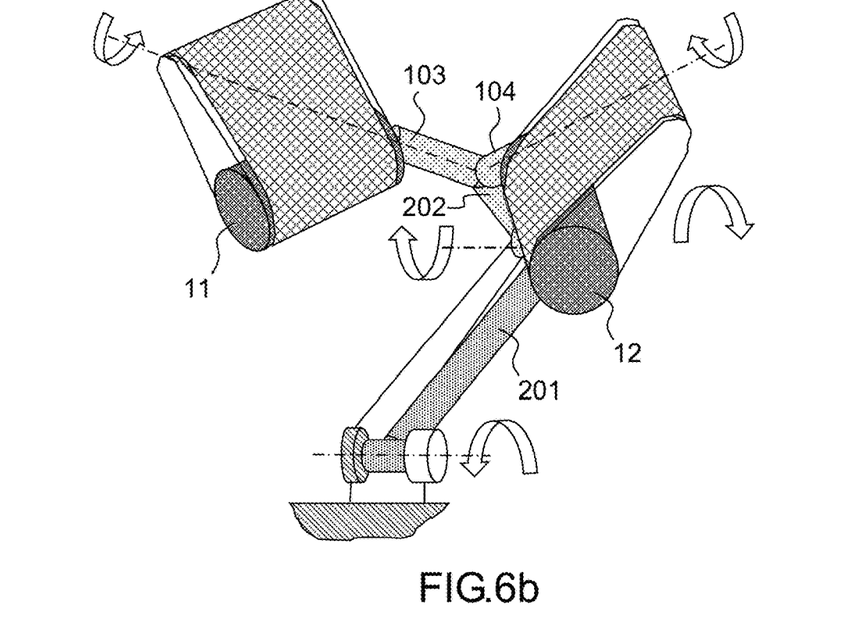
Figure 6C:
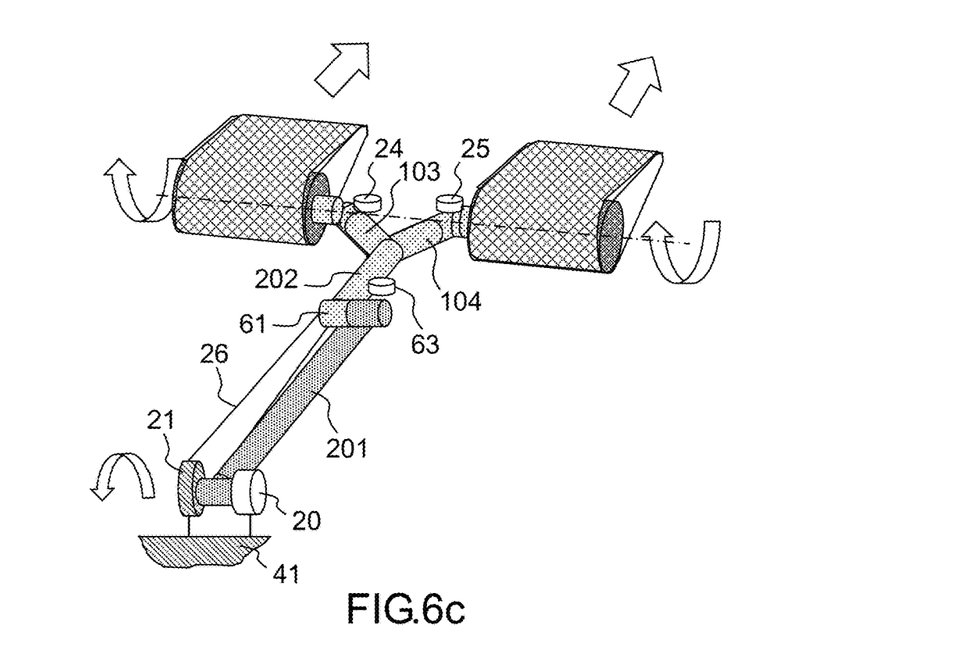

FIGS. 6a, 6b, 6c illustrate different deployment sequences in the variant embodiment in which two storage rollers 11, 12 are mounted on the mast 10 and in which the mast comprises two longitudinal rods 201, 202. In the stored position, the second rod 202 of the mast, equipped with the two lateral arms 103, 104 on which the two storage rollers are articulated, is folded back against the first rod 201, the lateral arms being oriented towards the base 102 of the mast. In order to ensure the deployment of the two rods 201, 202 of the mast and of the storage rollers 11, 12, go and return cables are fixed to the first pulley 21 situated at the base of the mast, which is fixed relative to the body of the satellite, and to a second pulley 61 mounted on the second longitudinal rod. Moreover, go and return cables are fixed to the driving pulleys 22, 23 of the rollers and to return pulleys 24, 25, 63 mounted on the lateral arms and on the first rod of the mast. The deployment principle is similar to that described in relation to FIGS. 3a, 3b, 3c, 3d. The actuation of the motor 20 situated at the base 102 of the mast drives the first rod of the mast in rotation, which causes the synchronized deployment of all of the deployable structure, including the second longitudinal rod of the mast, via the system of cables and of pulleys.

Figure 7:
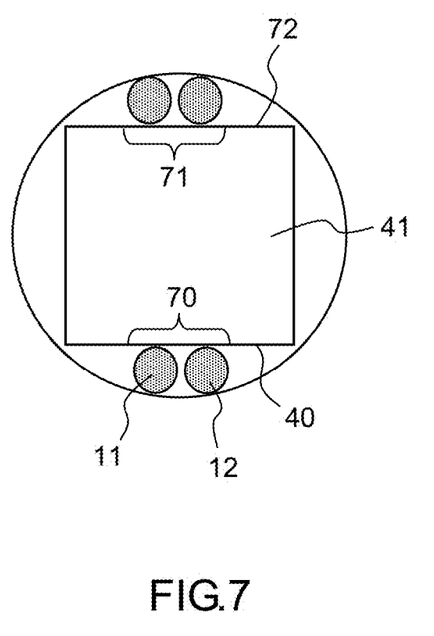
FIG. 7: a cross-sectional diagram of an exemplary satellite comprising flexible solar generators in stored position, under the nose cone of a rocket, according to the invention.

As represented in FIG. 7, a satellite equipped with at least one deployable structure according to the invention, comprising two solar generators wound around two respective rollers 11, 12, can be formed in a nose cone 5 of the narrow rocket. It is also possible, to balance the body 41 of the satellite, to form two deployable structures 70, 71 according to the invention, on two opposite faces 40, 72 of the body of the satellite. The deployable structures are, of course, respectively associated with a dedicated deployment system.

Although the invention has been described in relation to particular embodiments, it is clear that it is in no way limited thereto and that it comprises all the technical equivalents of the means described and their combinations provided the latter fall within the scope of the invention. In particular, the number and the placement of the different return pulleys is not limited to the examples specifically described.

The invention claimed is:

1. A deployable structure comprising a set of solar generators, a mast and two storage rollers each supporting a flexible solar generator, wherein the two storage rollers are articulated on the mast, wherein the mast has a first end, called base, a second end opposite the base, and comprises at least one longitudinal rod situated between the first and the second ends, wherein the mast further comprises two lateral arms mounted at the second end, the two lateral arms being inclined angularly in two opposite directions that are symmetrical relative to the longitudinal rod, each lateral arm comprising an end provided with a hollow guide, and wherein each storage roller has a longitudinal axis comprising a bent end forming a pivot respectively articulated inside the hollow guide of a corresponding lateral arm, the pivot of each storage roller having an axis of revolution different from the longitudinal axis of the corresponding storage roll.

2. The deployable structure according to claim 1, wherein the two lateral arms of the mast are secured to the longitudinal rod.

3. The deployable structure according to claim 1, wherein the longitudinal rod comprises two distinct longitudinal parts, respectively called first rod and second rod, the second rod being parallel to the first rod and articulated on an axis of rotation situated at the second end of the mast, the axis of rotation being at right angles to the first rod and to the second rod, the two lateral arms being secured to the second rod.

4. The deployable structure according to claim 2, wherein each flexible solar generator comprises a terminal end rigidly attached to a respective fixed rigid anchor point, and wherein the deployable structure further comprises at least one rigid flap fixed to the rigid anchor point, in the extension of a flexible solar generator, the rigid flap comprising solar cells permanently oriented towards the sun.

5. The deployable structure according to claim 3, wherein, in stored position, each flexible solar generator is partially wound around the storage roll, and comprises an end part provided with solar cells permanently oriented towards the sun.

6. The deployable structure according to claim 4, wherein the hollow guides of each lateral arm of the mast are oriented at 45° relative to the mast and relative to the respective longitudinal axes of the storage rollers.

7. The deployable structure according to claim 5, wherein the hollow guides of each lateral arm of the mast are oriented at 45° relative to the mast and relative to the respective longitudinal axes of the storage rollers.

8. A deployment system comprising a deployable structure according to claim 1, and further comprising a single motor comprising a rotor mounted on the base of the mast, the rotor having an axis of rotation at right angles to the longitudinal rod of the mast, a first pulley situated at the base of the mast and having an axis of revolution aligned with the axis of rotation of the rotor, two pulleys driving the storage rollers, in rotation, respectively fixed to the bent ends of each storage roll, return pulleys fixed to the lateral arms of the mast and a set of cables linking the first pulley to the pulleys driving each storage roller via the return pulleys, the driving pulleys having a respective axis of rotation coinciding with a longitudinal axis of the respective hollow guides.

9. The deployment system according to claim 8, wherein each pulley driving a storage roller has an axis of rotation forming an angle of 45° relative to the longitudinal axis of the corresponding storage roller and relative to the longitudinal rod of the mast.

10. A satellite, comprising at least one deployment system according to claim 8.

* * * * *